(12) United States Patent
Xu et al.

(10) Patent No.: US 12,068,358 B2
(45) Date of Patent: *Aug. 20, 2024

(54) SCAN NEEDLE AND SCAN DISPLAY SYSTEM INCLUDING SAME

(71) Applicant: Jade Bird Display (Shanghai) Limited, Shanghai (CN)

(72) Inventors: Qunchao Xu, Shanghai (CN); Qiming Li, Albuquerque, NM (US)

(73) Assignee: JADE BIRD DISPLAY (SHANGHAI) LIMITED, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/063,220

(22) Filed: Dec. 8, 2022

(65) Prior Publication Data

US 2023/0115197 A1    Apr. 13, 2023

Related U.S. Application Data

(63) Continuation of application No. 16/985,343, filed on Aug. 5, 2020, now Pat. No. 11,527,572.

(51) Int. Cl.
*H01L 33/58*   (2010.01)
*H01L 27/15*   (2006.01)
*G02B 3/00*    (2006.01)

(52) U.S. Cl.
CPC ............ *H01L 27/156* (2013.01); *H01L 33/58* (2013.01); *G02B 3/0056* (2013.01)

(58) Field of Classification Search
CPC ............................ H01L 27/156; H01L 33/58
See application file for complete search history.

(56) References Cited

U.S. PATENT DOCUMENTS

| | | | |
|---|---|---|---|
| 6,128,131 | A | 10/2000 | Tang |
| 9,635,325 | B2 | 4/2017 | Borthakur |
| 11,308,862 | B2* | 4/2022 | Xu ........................ H01L 27/156 |
| 2002/0153243 | A1 | 10/2002 | Forrest et al. |
| 2003/0222577 | A1 | 12/2003 | Lu |
| 2004/0036421 | A1 | 2/2004 | Arnold et al. |
| 2004/0114250 | A1 | 6/2004 | Kato |
| 2005/0122054 | A1 | 6/2005 | Seto |
| 2005/0200291 | A1 | 9/2005 | Naugler, Jr. et al. |

(Continued)

FOREIGN PATENT DOCUMENTS

| | | |
|---|---|---|
| CN | 110908105 | 3/2020 |
| CN | 111489659 | 8/2020 |

(Continued)

OTHER PUBLICATIONS

Office Action for U.S. Appl. No. 16/985,354 issued on Jul. 7, 2021.

(Continued)

*Primary Examiner* — Samuel A Gebremariam
(74) *Attorney, Agent, or Firm* — FINNEGAN, HENDERSON, FARABOW, GARRETT & DUNNER LLP

(57) ABSTRACT

A scan needle includes a substrate, a first color light emitting pixel array comprising a plurality of first color light emitting pixels formed on the substrate, a second color light emitting pixel array comprising a plurality of second color light emitting pixels formed on the substrate, and a third color light emitting pixel array comprising a plurality of third color light emitting pixels formed on the substrate.

18 Claims, 8 Drawing Sheets

(56) References Cited

U.S. PATENT DOCUMENTS

| | | |
|---|---|---|
| 2005/0243042 A1 | 11/2005 | Shivji |
| 2005/0264232 A1 | 12/2005 | Choi et al. |
| 2006/0007058 A1 | 1/2006 | Yamamoto et al. |
| 2006/0044630 A1 | 3/2006 | Feng |
| 2007/0019407 A1 | 1/2007 | Song |
| 2009/0051993 A1 | 2/2009 | Ito |
| 2010/0315597 A1 | 12/2010 | Powell et al. |
| 2011/0157216 A1 | 6/2011 | Yamazaki et al. |
| 2011/0315968 A1 | 12/2011 | Nowatari et al. |
| 2011/0317130 A1 | 12/2011 | Gollier |
| 2012/0037789 A1 | 2/2012 | Tian et al. |
| 2012/0148209 A1 | 6/2012 | Gunji |
| 2016/0372514 A1 | 12/2016 | Chang et al. |
| 2018/0157158 A1 | 6/2018 | Yaras |
| 2018/0308420 A1 | 10/2018 | Shin et al. |
| 2019/0012972 A1 | 1/2019 | Park et al. |
| 2019/0204725 A1 | 7/2019 | Yaras et al. |
| 2019/0348440 A1 | 11/2019 | Yu et al. |
| 2020/0058888 A1* | 2/2020 | Sugiyama ............... H05B 33/12 |
| 2020/0084868 A1 | 3/2020 | Bonne |
| 2020/0204764 A1 | 6/2020 | Chatterjee et al. |
| 2020/0357331 A1 | 11/2020 | Blank et al. |
| 2020/0357846 A1 | 11/2020 | Lee et al. |
| 2021/0090492 A1 | 3/2021 | Morita et al. |
| 2021/0093425 A1 | 4/2021 | Moalem |
| 2021/0225247 A1 | 7/2021 | Matsueda et al. |

FOREIGN PATENT DOCUMENTS

| | | |
|---|---|---|
| TW | 201714012 | 4/2017 |
| WO | WO 2014/207457 | 12/2014 |

OTHER PUBLICATIONS

Office Action for U.S. Appl. No. 16/985,368 issued on May 28, 2021.

Office Action for U.S. Appl. No. 16/985,372 issued on Aug. 6, 2021.

Office Action for U.S. Appl. No. 16/985,382 issued on Mar. 22, 2021.

Final Office Action for U.S. Appl. No. 16/985,382 issued on Jul. 13, 2021.

Office Action for U.S. Appl. No. 16/985,341 issued on Oct. 26, 2021.

Final Office Action for U.S. Appl. No. 16/985,368 issued on Oct. 7, 2021.

International Search Report and Written Opinion issued in PCT International Application No. PCT/IB2021/057112, mailed Nov. 19, 2021 (8 pp).

Partial Supplementary European Search Report in counterpart European Application No. EP21852898.2 dated Jun. 27, 2024.

* cited by examiner

US 12,068,358 B2

SCAN NEEDLE AND SCAN DISPLAY SYSTEM INCLUDING SAME

This application is a continuation of application Ser. No. 16/985,343, filed Aug. 5, 2020, the entire content of which is incorporated herein by reference.

FIELD OF THE DISCLOSURE

The present disclosure generally relates to a display system and, more particularly, to a display system including a scan needle and a displaying method of the display system.

BACKGROUND

A light emitting diode (LED), which is a kind of semiconductor diode, can convert electrical energy into optical energy, and emit different light having different colors depending on a material of a light emitting layer included in the LED.

A conventional LED display panel is formed by assembling a plurality of LEDs on a substrate. In order to display an image in a display area of the conventional LED display panel, it is necessary to form the plurality of LEDs in the entire display area of the display panel, which may require a complicated manufacturing process and a high manufacturing cost. In addition, because the conventional LED display includes a large number of LEDs, the conventional LED display has high power consumption.

SUMMARY

According to one embodiment of the present disclosure, a scan needle is provided. The scan needle includes a substrate, a first color light emitting pixel array comprising a plurality of first color light emitting pixels formed on the substrate, a second color light emitting pixel array comprising a plurality of second color light emitting pixels formed on the substrate, and a third color light emitting pixel array comprising a plurality of third color light emitting pixels formed on the substrate. One of the first color light emitting pixel comprises a first segment of a first color light emitting layer. One of the second color light emitting pixel comprises a second segment of the first color light emitting layer and a first segment of a second color light emitting layer, sequentially stacked on the substrate. One of the third color light emitting pixel comprises a third segment of the first color light emitting layer, a second segment of the second color light emitting layer, and a third color light emitting layer, sequentially stacked on the substrate.

DETAILED DESCRIPTION

Reference will now be made in detail to the present embodiments, examples of which are illustrated in the accompanying drawings. Wherever possible, the same reference numbers will be used throughout the drawings to refer to the same or like parts.

According to embodiments of the present disclosure, a scan needle includes a plurality of light emitting pixels for emitting light representative of each of a plurality of image portions. The light emitted from the scan needle is caused to move relative to a picture display screen at a predetermined frequency to successively project image portions on the picture display screen. As a result, an image formed by the image portions is displayed on the picture display screen.

Figure 1:
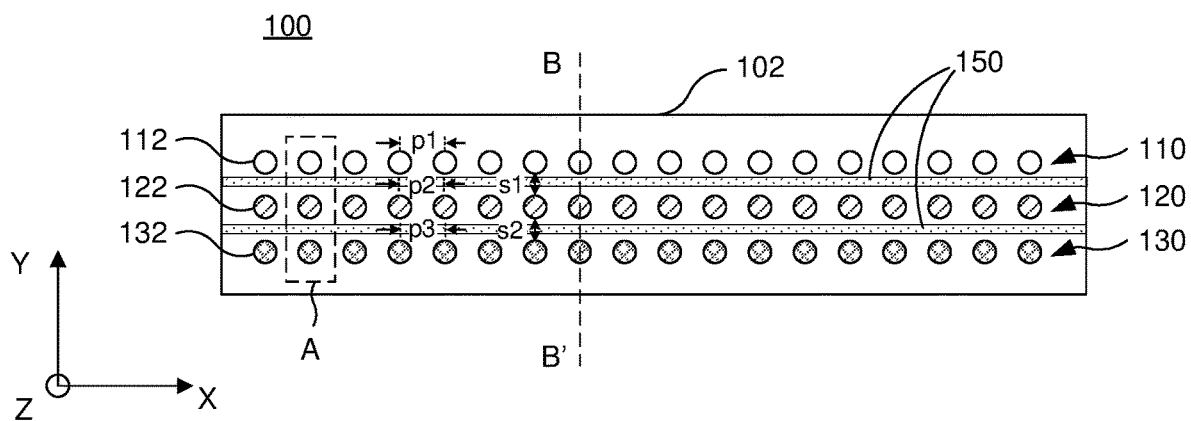
FIG. 1 is a top view of a scan needle, according to an embodiment of the present disclosure.

FIG. 1 is a top view of a scan needle 100, according to an embodiment of the present disclosure. Referring to FIG. 1, scan needle 100 includes a substrate 102, a first color light emitting pixel array 110 including a plurality of first color light emitting pixels 112 formed on substrate 102, a second color light emitting pixel array 120 including a plurality of second color light emitting pixels 122 formed on substrate 102, and a third color light emitting pixel array 130 including a plurality of third color light emitting pixels 132 formed on substrate 102. First color light emitting pixel array 110 is parallel to second color light emitting pixel array 120, and second color light emitting pixel array 120 is parallel to the third color light emitting pixel array 130.

An X-axis direction illustrated in the figures is defined as a horizontal direction. A Y-axis direction perpendicular to the X-axis direction is defined as a vertical direction. A Z-axis direction is perpendicular to the X-axis direction and the Y-axis direction. In the present disclosure, the "horizontal direction" and "vertical direction" are used for convenience of explanation, but are not intended to limit a particular orientation of any component described herein.

In the embodiment illustrated in FIG. 1, each one of first color light emitting pixel array 110, second color light emitting pixel array 120, and third color light emitting pixel array 130 includes pixels 112, 122, or 132 formed in a single row extending in the horizontal direction (the X-axis direction). First color light emitting pixel array 110, second color light emitting pixel array 120, and third color light emitting pixel array 130 are sequentially arranged in the vertical direction (the Y-axis direction).

First color light emitting pixels 112 in first color light emitting pixel array 110 emit light in a first color. Second color light emitting pixels 122 in second color light emitting pixel array 120 emit light in a second color. Third color light emitting pixels 132 in third color light emitting pixel array 130 emit light in a third color. The first color, the second color, and the third color are different from each other.

In the embodiment illustrated in FIG. 1, scan needle 100 further includes light-isolating walls 150 formed on substrate 102. Light-isolating walls 150 are disposed between first color light emitting pixel array 110 and second color light emitting pixel array 120, and between second color light emitting pixel array 120 and third color light emitting pixel array 130. Light-isolating walls 150 may be formed of any non-transparent material, e.g., non-transparent metal, to isolate the light emitted from first color light emitting pixel array 110, second color light emitting pixel array 120, and third color light emitting pixel array 130.

The first color may be any color selected from red, green, blue, yellow, orange, and cyan, and different from the second and third colors. The second color may be any color selected from green, blue, red, yellow, orange, and cyan, and different from the first and third colors. The third color may be any color selected from blue, red, green, yellow, orange, and cyan, and different from the first and second colors. In one embodiment, each of first color light emitting pixels 112 includes a red light emitting pixel, each of second color light emitting pixels 122 includes a blue light emitting pixel, and each of third color light emitting pixels 132 includes a green light emitting pixel.

In some embodiments of the present disclosure, a first pitch p1 of first color light emitting pixels 112 (i.e., a distance between centers of two adjacent first color light emitting pixels 112) in the row of first color light emitting pixel array 110 is less than 5 μm. A second pitch p2 of second color light emitting pixels 122 (i.e., a distance between centers of two adjacent second color light emitting pixels 122) in the row of second color light emitting pixel array 120 is less than 5 μm. A third pitch of third color light emitting pixels 132 (i.e., a distance between centers of two adjacent third color light emitting pixels 132) in the row of third color light emitting pixel array 130 is less than 5 μm. A first spacing s1 between the first color light emitting pixel array 110 and the second color light emitting pixel array 120 is less than 100 μm. A second spacing s2 between the second color light emitting pixel array 120 and the third color light emitting pixel array 130 is less than 100 μm.

In some embodiments of the present disclosure, first color light emitting pixels 112 in first color light emitting pixel array 110 are formed to have the same size and the same structure. Second color light emitting pixels 122 in second color light emitting pixel array 120 are formed to have the same size and the same structure. Third color light emitting pixels 132 in third color light emitting pixel array 130 are formed to have the same size and the same structure.

In the embodiment illustrated in FIG. 1, scan needle 100 includes all of first color light emitting pixel array 110, second color light emitting pixel array 120, and third color light emitting pixel array 130. However, the present disclosure is not limited thereto. In alternative embodiments of the present disclosure (not illustrated), scan needle 100 may include only one of first color light emitting pixel array 110, second color light emitting pixel array 120, or third color light emitting pixel array 130 formed on substrate 102. In still some alternative embodiments of the present disclosure (not illustrated), scan needle 100 may include only two of first color light emitting pixel array 110, second color light emitting pixel array 120, and third color light emitting pixel array 130.

In the embodiment illustrated in FIG. 1, the number of first color light emitting pixels 112 in first color light emitting pixel array 110 is the same as the number of second color light emitting pixels 122 in second color light emitting pixel array 120. Further, the number of second color light emitting pixels 122 in second color light emitting pixel array 120 is the same as the number of third color light emitting pixels 132 in third color light emitting pixel array 130.

In the embodiment illustrated in FIG. 1, each one of first color light emitting pixel array 110, second color light emitting pixel array 120, and third color light emitting pixel array 130 includes pixels 112, 122, or 132 formed in a single row extending in the horizontal direction. However, the present disclosure is not limited thereto. In some embodiments explained in further detail below, at least one of first color light emitting pixel array 110, second color light emitting pixel array 120, and third color light emitting pixel array 130 may include pixels formed in a two-dimensional array including at least two columns and two rows.

Figure 2A:
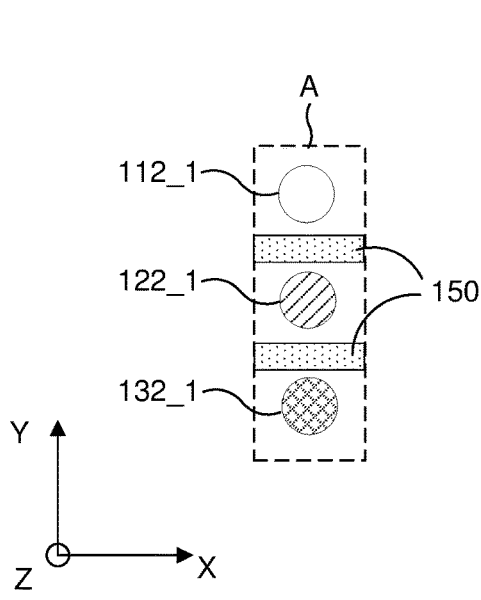
FIGS. 2A and 2B are enlarged top views of a region of the scan needle of FIG. 1, according to embodiments of the present disclosure.

FIG. 2A is an enlarged top view of a region A of scan needle 100, according to an embodiment of the present disclosure. Referring to FIG. 2A, region A of scan needle 100 includes a first color light emitting pixel 112_1, a second color light emitting pixel 122_1, and a third color light emitting pixel 132_1. Each one of first color light emitting pixel 112_1, second color light emitting pixel 122_1, and third color light emitting pixel 132_1 is substantially circular in the top view. The shape of a single light emitting pixel is not limited herein. That is, the shape of a single light emitting pixel may be circular, square, rectangular, and so on.

A dimension of a singular light emitting pixel is in the range of the 0.5 μm to 50 μm. In one embodiment, a diameter of each one of first color light emitting pixel 112_1, second color light emitting pixel 122_1, and third color light emitting pixel 132_1 is substantially the same, e.g., 0.5 μm to 50 μm. However, the dimensions of the three light emitting pixels are not limited herein. That is, the dimensions of the three light emitting pixels 112_2, 122_2, and 132_2 may be the same as each other, or may be different from each other.

Figure 2B:
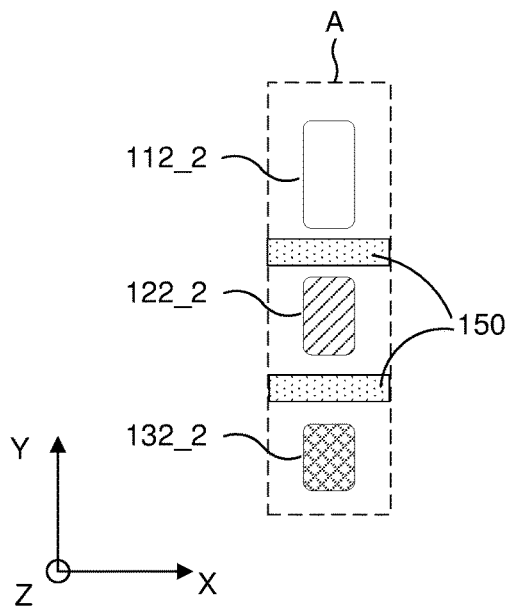

FIG. 2B is an enlarged top view of a region A of scan needle 100, according to another embodiment of the present disclosure. Referring to FIG. 2B, region A of scan needle 100 includes a first color light emitting pixel 112_2, a second color light emitting pixel 122_2, and a third color light emitting pixel 132_2. Each one of first color light emitting pixel 112_2, second color light emitting pixel 122_2, and third color light emitting pixel 132_2 is substantially rectangular in the top view. A size along the horizontal (X-axis) direction of first color light emitting pixel 112_2, second color light emitting pixel 122_2, and third color light emitting pixel 132_2 is substantially the same, e.g., 0.5 μm to 50 μm. A size of first color light emitting pixel 112_2 along the vertical (Y-axis) direction is, e.g., 0.5 μm to 50 μm. A size of second color light emitting pixel 122_2 along the vertical direction is, e.g., 0.5 μm to 50 μm. A size of third color light emitting pixel 132_2 along the vertical direction is, e.g., 0.5 μm to 50 μm.

In one embodiment, an area of first color light emitting pixel 112_2 is larger than an area of second color light emitting pixel 122_2, and an area of second color light emitting pixel 122_2 is larger than an area of third color light emitting pixel 132_2. However, the areas of the three light emitting pixels are not limited herein. That is, the areas of the three light emitting pixels 112_2, 122_2, and 132_2 may be the same as each other, or may be different from each other.

Figure 3A:
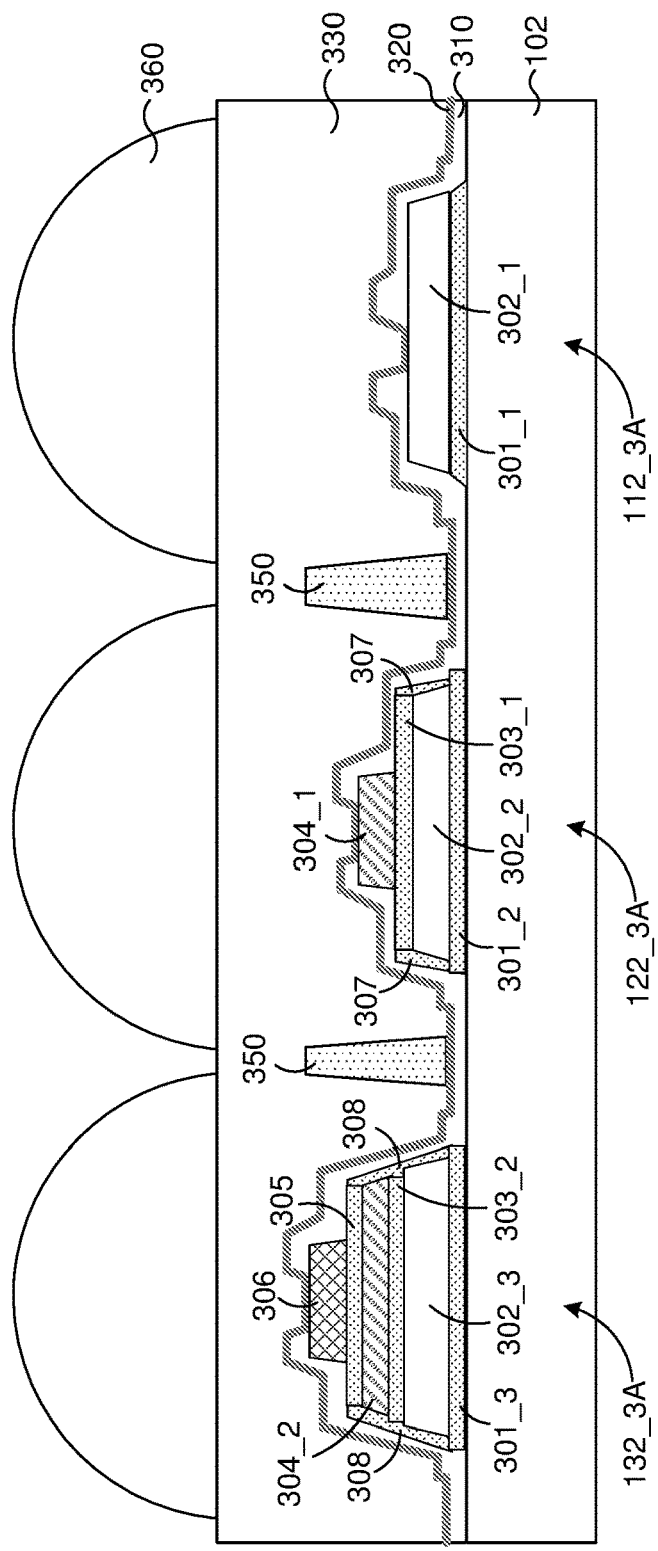
FIG. 3A is a cross-sectional view of the scan needle along a section line B-B' of FIG. 1, according to an embodiment of the present disclosure.

FIG. 3A illustrates one configuration of scan needle 100, as a scan needle 100a shown in a cross-sectional view along a section line B-B' of FIG. 1, according to an embodiment of the present disclosure. Referring to FIG. 3A, scan needle 100A includes a first color light emitting pixel 112_3A in first color light emitting pixel array 110, a second color light emitting pixel 122_3A in second color light emitting pixel array 120, and a third color light emitting pixel 132_3A in third color light emitting pixel array 130 arranged side-by-side on substrate 102. First color light emitting pixel 112_3A comprises a first color light emitting diode, and is referred to herein as first color light emitting diode 112_3A. Second color light emitting pixel 122_3A comprises a second color light emitting diode, and is referred to herein as second color light emitting diode 122_3A. Third color light emitting pixel 132_3A comprises a third color light emitting diode, and is referred to herein as third color light emitting diode 132_3A.

Although FIG. 3A illustrates that first color light emitting diode 112_3A, second color light emitting diode 122_3A, and third color light emitting diode 132_3A are arranged in the vertical (Y-axis) direction, the present disclosure is not limited therefore.

In some alternative embodiments, first color light emitting diode 112_3A, second color light emitting diode 122_3A, and third color light emitting diode 132_3A may be arranged in the horizontal (X-axis) direction.

As illustrated in FIG. 3A, first color light emitting diode 112_3A includes, at least, a first segment 301_1 of a first metal layer and a first segment 302_1 of a first color light emitting layer, in an order from bottom to top as viewed in FIG. 3A. Second color light emitting diode 122_3A includes, at least, a second segment 301_2 of the first metal layer, a second segment 302_2 of the first color light emitting layer, a first segment 303_1 of a second metal layer, and a first segment 304_1 of a second color light emitting layer, in an order from bottom to top as viewed in FIG. 3A, and at least one first electrical connector 307. The second segment 301_2 of the first metal layer and the first segment 303_1 of the second metal layer are electrically connected with each other by the at least one first electrical connector 307. Third color light emitting diode 132_3A includes, at least, a third segment 301_3 of the first metal layer, a third segment 302_3 of the first color light emitting layer, a second segment 303_2 of the second metal layer, a second segment 304_2 of the second color light emitting layer, a third metal layer 305, and a third color light emitting layer 306, in an order from bottom to top as viewed in FIG. 3A, and at least one second electrical connector 308. The third segment 301_3 of the first metal layer, the second segment 303_2 of the second metal layer, and third metal layer 305 are electrically connected with each other by the at least one second electrical connector 308.

Scan needle 100A also includes an insulating layer 310 and a transparent conductive layer 320 covering first color light emitting diode 112_3A, second color light emitting diode 122_3A, and third color light emitting diode 132_3A. Insulating layer 310 is formed with openings exposing portions of the top surfaces of first segment 302_1 of the first color light emitting layer, first segment 304_1 of the second color light emitting layer, and third color light emitting layer 306. Transparent conductive layer 320 covers insulating layer 310 and is formed in the openings of insulating layer 310, thereby contacting the exposed top surfaces of first segment 302_1 of the first color light emitting layer, first segment 304_1 of the second color light emitting layer, and third color light emitting layer 306 via the openings.

Scan needle 100 further includes light-isolating walls 350 arranged between first color light emitting diode 112_3A and second color light emitting diode 122_3A, and between second color light emitting diode 122_3 and third color light emitting diode 132_3. The height of light-isolating walls 350 may be greater than the highest one of first color light emitting diode 112_3, second color light emitting diode 122_3, and third color light emitting diode 132_3. In the embodiment illustrated in FIG. 3A, the height of light-isolating walls 350 is greater than the height of third color light emitting diode 132_3.

Moreover, scan needle 100 includes a transparent isolation layer 330 covering all of first color light emitting diode 112_3A, second color light emitting diode 122_3A, third color light emitting diode 132_3A, insulating layer 310, a transparent conductive layer 320, and light-isolating walls 350. In addition, microlenses 360 are formed on each one of first color light emitting diode 112_3A, second color light emitting diode 122_3A, and third color light emitting diode 132_3A.

Substrate 102 may be an integrated circuit (IC) substrate which includes an interconnection layer electrically connected with the first segment of first metal layer 301-1 in first color light emitting diode 112_3, the second segment of the first metal layer 301_2 in second color light emitting diode 122_3, and the third segment of the first metal layer 301_3 in third color light emitting diode 132_3. Herein, the IC substrate at least includes a drive circuit which separately controls each of first color light emitting diode 112_3A, second color light emitting diode 122_3A, and third color light emitting diode 132_3A.

Figure 3B:
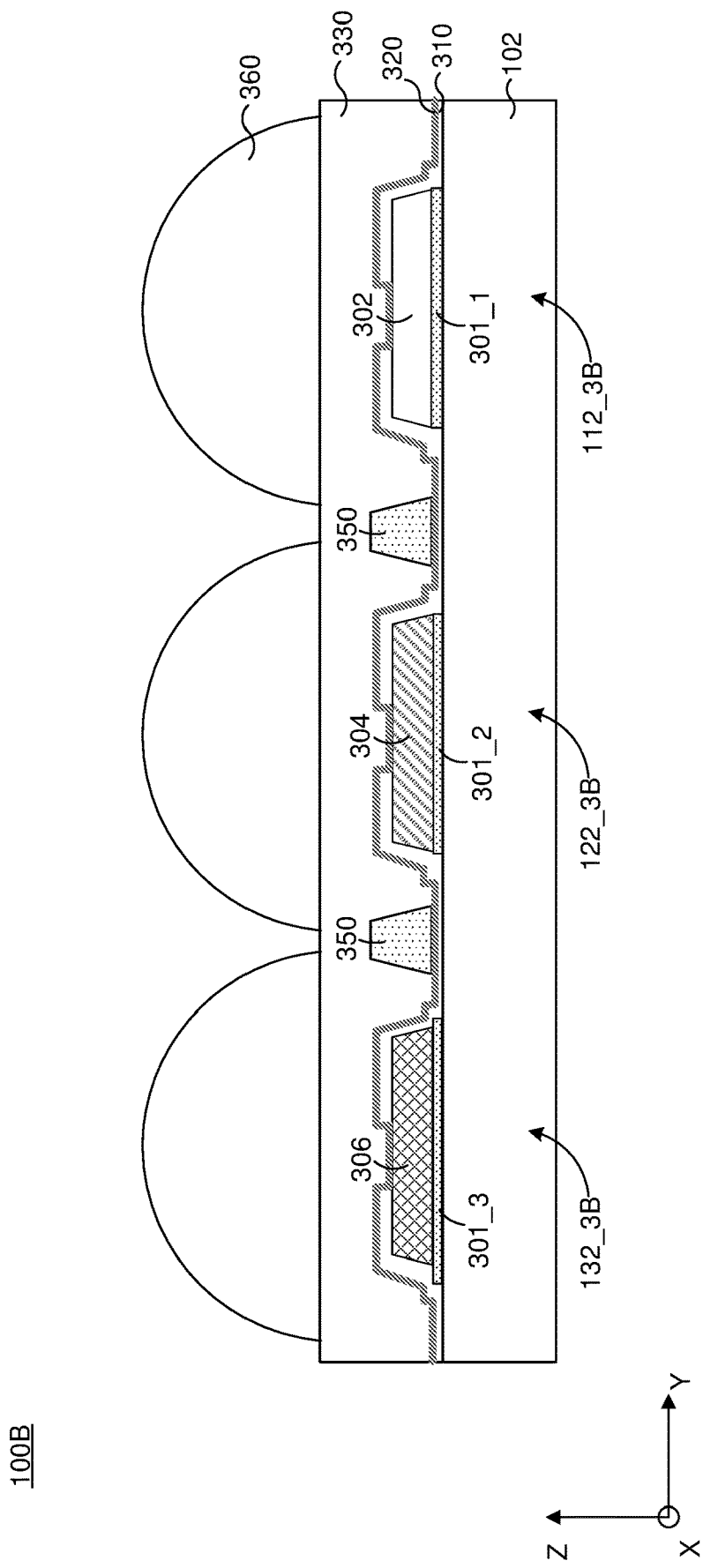
FIG. 3B is a cross-sectional view of the scan needle along a section line B-B' of FIG. 1, according to another embodiment of the present disclosure.

FIG. 3B illustrates another configuration of scan needle 100, as a scan needle 100B shown in is a cross-sectional view along a section line B-B' of FIG. 1, according to another embodiment of the present disclosure. Elements of scan needle 100B that are the same as those of scan needle 100A are identified by the same reference numbers. As illustrated in FIG. 3B, scan needle 100B includes a first color light emitting diode 112_3B in first color light emitting pixel array 110, a second color light emitting diode 122_3B in second color light emitting pixel array 120, and a third color light emitting diode 132_3B in third color light emitting pixel array 130 arranged side-by-side on substrate 102.

First color light emitting diode 112_3B includes, at least, first segment 301_1 of first metal layer and first color light emitting layer 302, in an order from bottom to top as viewed in FIG. 3B. Second color light emitting diode 122_3B includes, at least, second segment 301_2 of the first metal layer and second color light emitting layer 304, in an order from bottom to top as viewed in FIG. 3B. Third color light emitting diode 132_3B includes, at least, third segment 301_3 of the first metal layer and third color light emitting layer 306, in an order from bottom to top as viewed in FIG. 3B.

Scan needle 100B also includes insulating layer 310 and transparent conductive layer 320 covering first color light emitting diode 112_3B, second color light emitting diode 122_3B, and third color light emitting diode 132_3B. Insulating layer 310 is formed with openings exposing portions of the top surfaces of first color light emitting layer 302, second color light emitting layer 304, and third color light emitting layer 306. Transparent conductive layer 320 covers insulating layer 310 and is formed in the openings of insulating layer 310, thereby contacting the exposed top surfaces of first color light emitting layer 302, second color light emitting layer 304, and third color light emitting layer 306 via the openings.

Scan needle 100B further includes light-isolating walls 350 arranged between first color light emitting diode 112_3B and second color light emitting diode 122_3B, and between second color light emitting diode 122_3B and third color light emitting diode 132_3B. The height of light-isolating walls 350 may be greater than the highest one of first color light emitting diode 112_3B, second color light emitting diode 122_3B, and third color light emitting diode 132_3B. In the embodiment illustrated in FIG. 3B, first color light emitting diode 112_3B, second color light emitting diode 122_3B, and third color light emitting diode 132_B3 have substantially the same height. Thus, the height of light-isolating walls 350 is greater than all of first color light emitting diode 112_3B, second color light emitting diode 122_3B, and third color light emitting diode 132_3B.

Moreover, scan needle 100B includes transparent isolation layer 330 covering all of first color light emitting diode 112_3, second color light emitting diode 122_3, third color light emitting diode 1323, insulating layer 310, a transparent conductive layer 320, and light-isolating walls 350. In addition, microlenses 360 are formed on each one of first color light emitting diode 112_3, second color light emitting diode 1223, third color light emitting diode 132_3.

While FIGS. 3A and 3B illustrate two examples of the structures of the light emitting pixels, the present disclosure is not limited thereto. First color light emitting pixels 112, second color light emitting pixels 122, and third color light emitting pixels 132 may be formed in any structure that can respectively emit light in the first color, second color, and third color.

Figure 4:
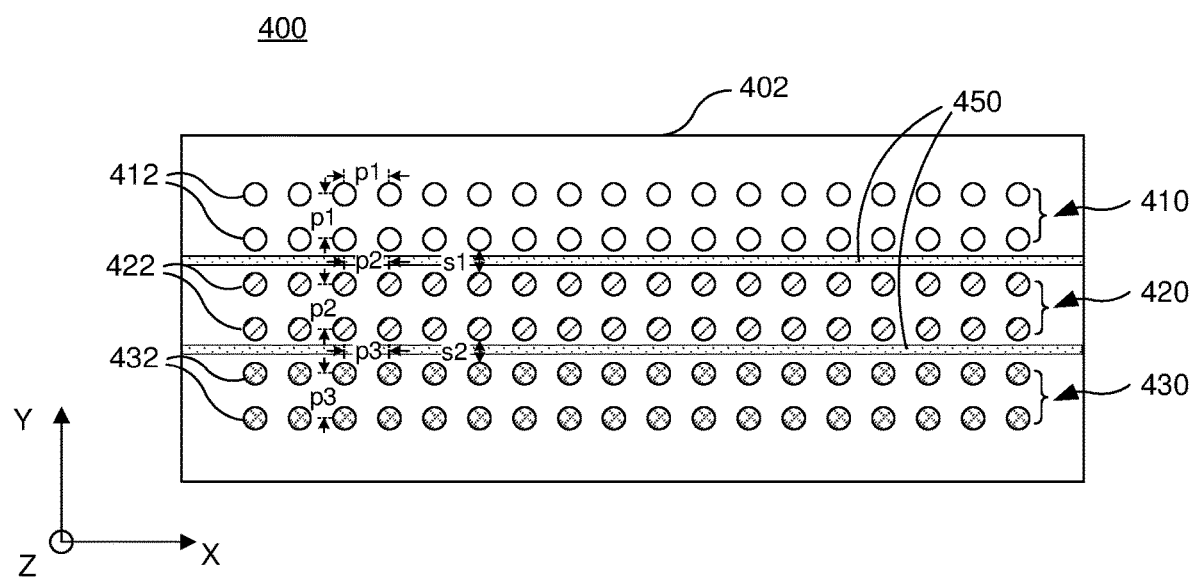
FIG. 4 is a top view of a scan needle, according to an embodiment of the present disclosure.

FIG. 4 is a top view of a scan needle 400, according to an embodiment of the present disclosure. Referring to FIG. 4, scan needle 400 includes a substrate 402, a first color light emitting pixel array 410 including a plurality of first color light emitting pixels 412 formed on substrate 402, a second color light emitting pixel array 420 including a plurality of second color light emitting pixels 422 formed on substrate 402, and a third color light emitting pixel array 430 comprising a plurality of third color light emitting pixels 232 formed on substrate 402. First color light emitting pixel array 410 is parallel to second color light emitting pixel array 420, and second color light emitting pixel array 420 is parallel to the third color light emitting pixel array 430.

Each one of first color light emitting pixel array 410, second color light emitting pixel array 420, and third color light emitting pixel array 430 includes pixels formed in a two-dimensional array (i.e., a matrix) having at least two rows extending in the horizontal direction and at least two columns extending in the vertical direction as viewed in FIG. 4.

In the embodiment illustrated in FIG. 4, scan needle 400 further includes light-isolating walls 450 formed on substrate 402. Light-isolating walls 450 are disposed between first color light emitting pixel array 410 and second color light emitting pixel array 420, and between second color light emitting pixel array 420 and third color light emitting pixel array 430. Light-isolating walls 450 may be formed of any non-transparent material, e.g., non-transparent metal, to isolate the light emitted from first color light emitting pixel array 410, second color light emitting pixel array 420, and third color light emitting pixel array 430.

In the embodiment illustrated in FIG. 4, each one of first color light emitting pixel array 410, second color light emitting pixel array 420, and third color light emitting pixel array 430 is a 18×2 array including 18 columns each extending in the vertical direction and 2 rows each extending in the horizontal direction. In some alternative embodiments of the present disclosure, each one of first color light emitting pixel array 410, second color light emitting pixel array 420, and third color light emitting pixel array 430 may be a 4000×50 array including 4000 columns each extending in the vertical direction and 50 rows each extending in the horizontal direction.

In some embodiments of the present disclosure, a first pitch p1 of first color light emitting pixels 412 (i.e., a distance between centers of two adjacent first color light emitting pixels 412) in both the horizontal direction and the vertical direction is less than 5 μm. A second pitch p2 of second color light emitting pixels 422 (i.e., a distance between centers of two adjacent second color light emitting pixels 422) in both the horizontal direction and the vertical direction is less than 5 μm. A third pitch of third color light emitting pixels 432 (i.e., a distance between centers of two adjacent third color light emitting pixels 432) in both the horizontal direction and the vertical direction is less than 5 μm. A first spacing s1 between the first color light emitting pixel array 410 and the second color light emitting pixel array 420 is less than 100 μm. A second spacing s2 between the second color light emitting pixel array 420 and the third color light emitting pixel array 430 is less than 100 μm.

An aspect ratio of a light emitting pixel array is defined herein as a ratio of a width of the light emitting pixel array (i.e., a size of a longer side of the light emitting pixel array) to a length of the light emitting pixel array (i.e., a size of a shorter side of the light emitting pixel array). According to some embodiments of the present disclosure, an aspect ratio of first color light emitting pixel array 410 is not less than 10:1. According to an alternative embodiment of the present disclosure, an aspect ratio of first color light emitting pixel array 410 is not less than 100:1.

In some embodiments of the present disclosure, a total size of scan needle 400 along the vertical direction is not more than 1 mm. In some embodiments of the present disclosure, a total aspect ratio of scan needle 400 is not less than 3:1.

In scan needles according to some embodiments of the present disclosure, at least one of the first color light emitting pixel array, the second color light emitting pixel array, and the third color light emitting pixel array may be formed as a single row, and at least one of the remaining first color light emitting pixel array, second color light emitting pixel array, and third color light emitting pixel array may be formed as a two-dimensional array. For example, a scan needle may include a first color light emitting pixel array formed as a single row, and a second color light emitting pixel array and a third color light emitting pixel array each formed as a two-dimensional array.

In some embodiments, the total area of first color light emitting pixel array 410 may be the same as the total area of second color light emitting pixel array 420, and the total area of second color light emitting pixel array 420 may be the same as the total area of third color light emitting pixel array 430.

Figure 5:
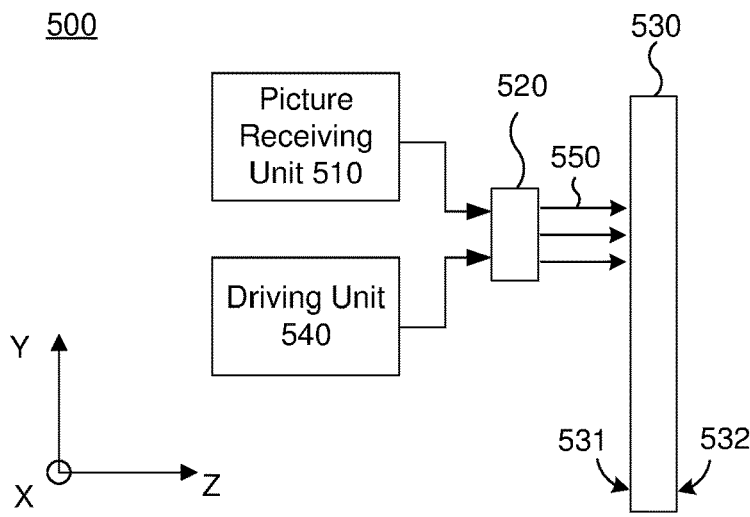
FIG. 5 is a schematic view illustrating a scan display system, according to an embodiment of the present disclosure.

FIG. 5 is a schematic view illustrating a scan display system 500, according to an embodiment of the present disclosure. Referring to FIG. 5, scan display system 500 includes a picture receiving unit 510, a scan needle 520, a picture display screen 530 having first and second opposing surfaces 531 and 532, and a driving unit 540.

Picture receiving unit 510 is configured to receive picture data and is coupled to a drive circuit (e.g., a drive circuit formed in substrate 102 illustrated in FIG. 3) of scan needle 520 to transmit the picture data to the drive circuit of scan needle 520. Scan needle 520 is configured to be driven by the drive circuit to emit light 550, representative of each of a plurality of portions of an image (hereinafter referred to as "image portions"), and to successively project light 550 representative of the plurality of image portions to first surface 531 of picture display screen 530. Picture display screen 530 is configured to receive the emitted light 550 on first surface 531 and display the image portions on second surface 532. Driving unit 540 is coupled to scan needle 520 and configured to perform a picture scanning process by moving scan needle 520 to scan in the vertical direction relative to first surface 531 of picture display screen 530 at a predetermined frequency, such that the plurality of image portions displayed on second surface 532 of picture display screen 530 are successively arranged along the vertical direction of picture display screen 530. The predetermined frequency may be not less than 10 Hz. In other words, a time interval for a repeated occurrence of an image portion at a position on picture display screen 530 may be less than 0.1 s. As a result of the persistence of vision phenomena (when an image seen by the human eye disappears, the human eye can continue to retain the image for about 0.1 s to 0.4 s), picture display screen 530 displays an image including the plurality of image portions on second surface 532.

Figure 6:
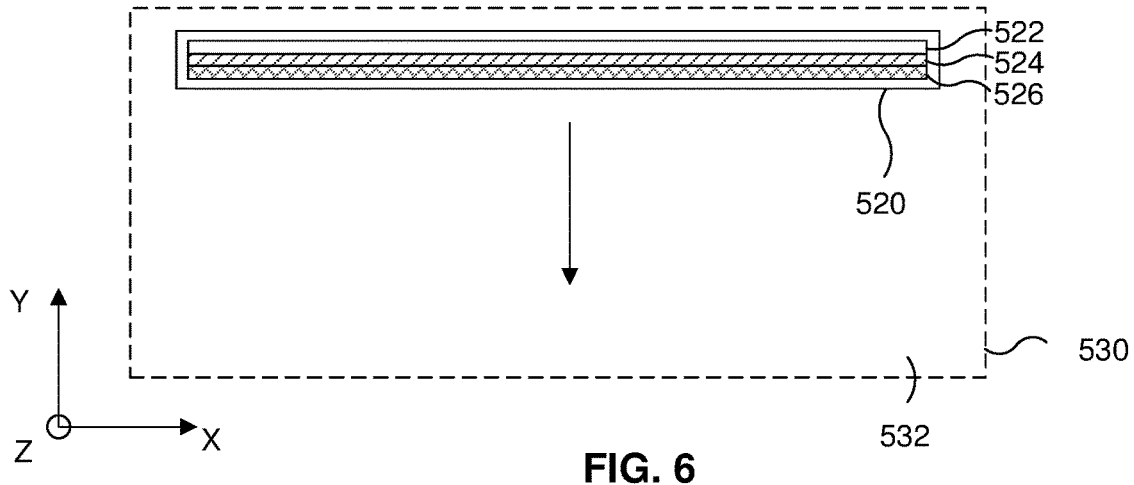
FIG. 6 is a top view of a scan needle and a picture display screen during a picture scanning process, according to an embodiment of the present disclosure.

FIG. 6 schematically illustrates scan needle 520 and picture display screen 530 during a picture scanning process as viewed along the Z-axis direction from a front side of picture display screen 530 and facing second surface 532 of picture display screen 530, according to an embodiment of the present disclosure. For the convenience of describing the relative positions of scan needle 520 and picture display screen 530, picture display screen 530 is illustrated as transparent in FIG. 6 to show scan needle 520 arranged behind picture display screen 530.

As shown in FIG. 6, scan needle 520 includes a first color light emitting pixel array 522 including a plurality of first color light emitting pixels (not illustrated), a second color light emitting pixel array 524 including a plurality of second color light emitting pixels (not illustrated), and a third color light emitting pixel array 526 including a plurality of third color light emitting pixels (not illustrated). First color light emitting pixel array 522, second color light emitting pixel array 524, and third color light emitting pixel array 526 are parallel to each other and sequentially arranged along the vertical direction.

Figure 7:
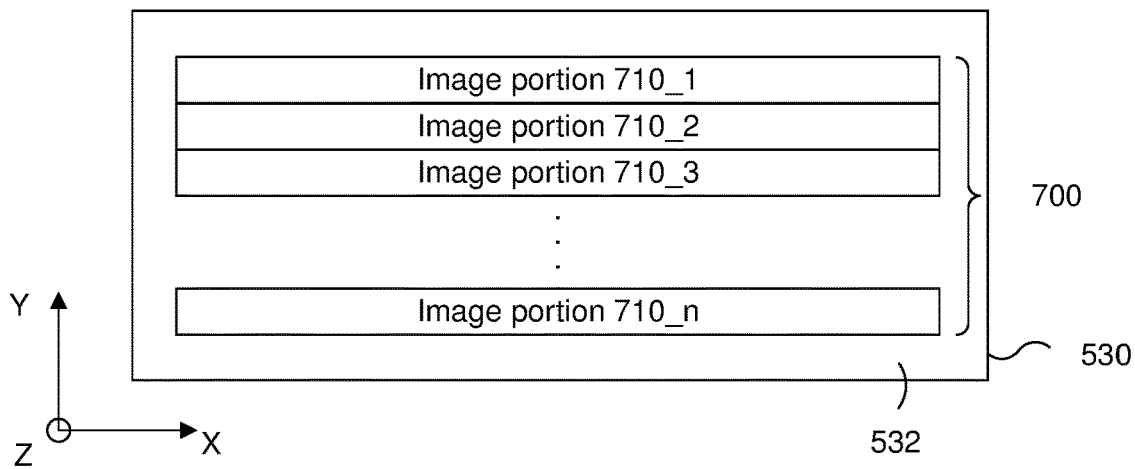
FIG. 7 is a top view of a picture display screen with an image displayed thereon during a picture scanning process, according to an embodiment of the present disclosure.

FIG. 7 schematically illustrates picture display screen 530 with an image 700 displayed on second surface 532 during a picture scanning process, according to an embodiment of the present disclosure.

Referring to FIGS. 5, 6, and 7, during the picture scanning process, scan needle 520 is driven by driving unit 540 to move in the vertical direction relative to first surface 531 of picture display screen 530. At an initial time point t1 during the picture scanning process, scan needle 520 is located at an initial position and projects a first image portion 710_1 on picture display screen 530 at a first and top-most position. At a second time point t2, scan needle 520 is moved down along the vertical direction and projects a second image portion 710_2 on picture display screen 530 at a second position below the first position. Image portion 7102 may be immediately adjacent to image portion 710_1. Alternatively, a top portion of image portion 710_2 may overlap with a bottom portion of image portion 710_1. At a third time point t3, scan needle 520 is moved down along the vertical direction and projects a third image portion 710_3 on picture display screen 530 at a third position below the second position. Image portion 710_3 may be immediately adjacent to image portion 710_2. Alternatively, a top portion of image portion 710_3 may overlap with a bottom portion of image portion 710_2. In this manner, the picture scanning process continues with scan needle 520 successively projecting image portions at successive time points until scan needle 520 projects a final image portion 710_$n$ on picture display screen 530 at a bottom-most position. As a result, a full image 700 formed by image portions 710_1, 7102, 710_3, ..., and 710_$n$ is displayed on picture display screen 530. Afterwards, scan needle 520 is moved by driving unit 540 back to the initial position and then projects a series of updated image portions 710_1, 710_2, 710_3, ..., and 710_$n$ on picture display screen 530 to display an updated image. The frequency at which scan needle 520 scans is relatively high, so that human eyes will observe a continues image on picture display screen 530.

Figure 8:
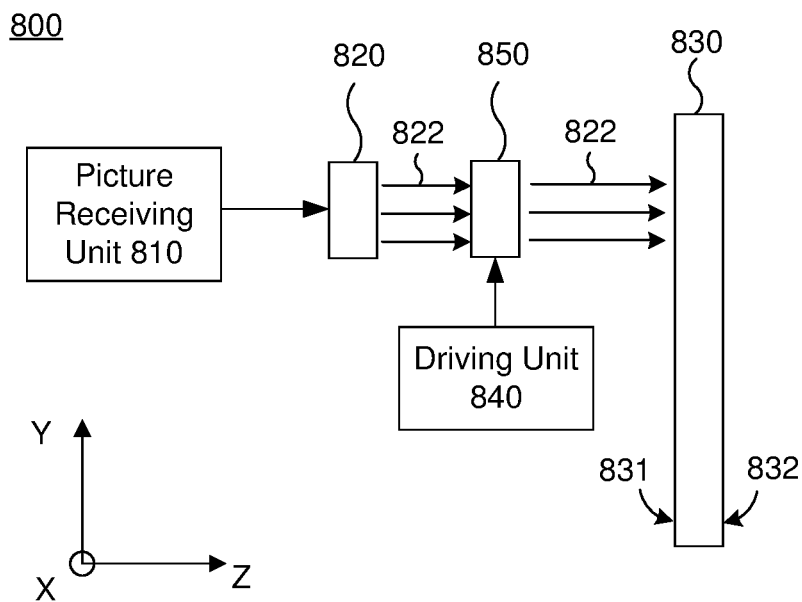
FIG. 8 is a schematic view illustrating a scan display system, according to an embodiment of the present disclosure.

FIG. 8 is a schematic view illustrating a scan display system 800 according to an embodiment of the present disclosure. Referring to FIG. 8, scan display system 800 includes a picture receiving unit 810, a scan needle 820, a picture display screen 830 having first and second opposing surfaces 831 and 832, a driving unit 840, and a projection unit 850.

Picture receiving unit 810 is configured to receive picture data and is coupled to the scan needle to transmit the picture data to scan needle 820. Scan needle 820 is configured to successively emit light 822, representative of each of a plurality of portions of an image (hereinafter referred to as "image portions"), at successive time points. Projecting unit 850 may include a lens or a mirror, and is configured to successively project light 822 emitted from scan needle 820 representative of the plurality of image portions to first surface 831 of picture display screen 830. Picture display screen 830 is configured to receive the projected light 822 on first surface 831 and display the image portions on second surface 832. Driving unit 840 is coupled to projecting unit 850 and configured to perform a picture scanning process by moving the lens or mirror in projecting unit 850 to redirect light 822 projected from projecting unit 820, such that light 822 moves in the vertical direction relative to first surface 831 of picture display screen 830 at a predetermined frequency. For example, driving unit 840 may be configured to rotate or tilt the lens or the mirror included in projecting unit 850 to redirect light 822 emitted from scan needle 820 to different positions on first surface 831 of picture display screen. As a s result, picture display screen 830 displays an image including the plurality of image portions on second surface 832.

Figure 9:
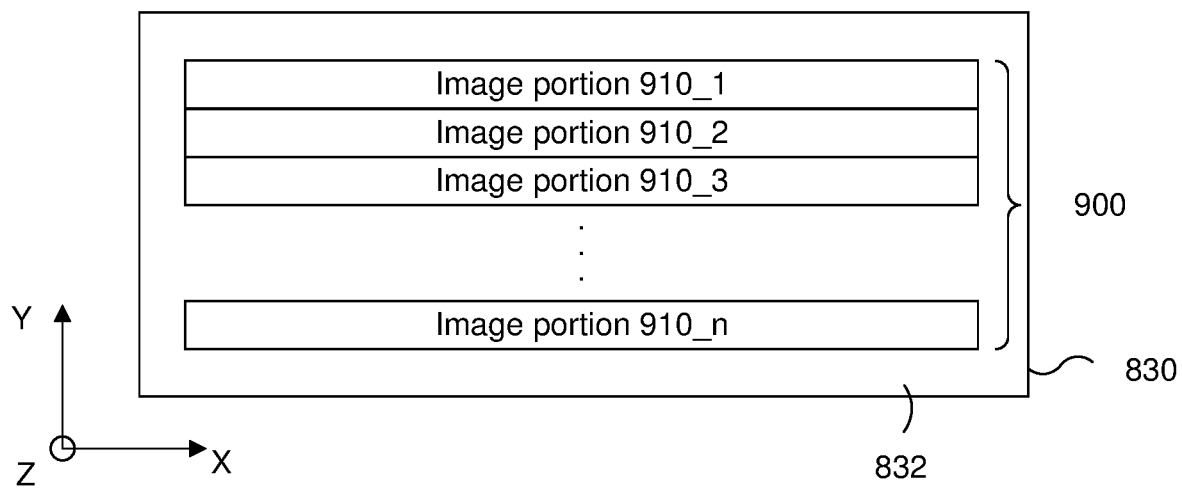
FIG. 9 is a top view of a picture display screen with an image displayed thereon during a picture scanning process, according to an embodiment of the present disclosure.

FIG. 9 schematically illustrates picture display screen 830 with an image 900 displayed on second surface 832 during a picture scanning process, according to an embodiment of the present disclosure.

Referring to FIGS. 8 and 9, during the picture scanning process, projecting unit 850 is driven by driving unit 840 to scan light 822 in the vertical direction relative to first surface 831 of picture display screen 830. At an initial time point t1 during the picture scanning process, projecting unit 850 is at an initial position to project a first image portion 910_1 on picture display screen 830 at a first and top-most position. First image portion 910_1 is light 822 emitted by scan needle 820 and representative of picture data that is projected by projecting unit 850. At a second time point t2, projecting unit 850 is moved by driving unit 840 to project a second image portion 910_2 on picture display screen 830 at a second position below the first position as viewed in FIG. 9. Image portion 910_2 may be immediately adjacent to image portion 910_1. Alternatively, a top portion of image portion 910_2 may overlap with a bottom portion of image portion 910_1. At a third time point t3, projecting unit 850 is moved by driving unit 840 to project a third image portion 910_3 on picture display screen 830 at a third position below the second position as viewed in FIG. 9. Image portion 910_3 may be immediately adjacent to image portion 910_2. Alternatively, a top portion of image portion 910_3 may overlap with a bottom portion of image portion 910_2. In this manner, the picture scanning process continues with projecting unit 850 successively projecting image portions at successive time points until projecting unit 850 projects a final image portion 910_n on picture display screen 830 at a bottom-most position. As a result, a full image 900 formed by image portions 910_1, 910_2, 910_3, . . . , and 910_n is displayed on picture display screen 830. Afterwards, projecting unit 850 is moved by driving unit 840 to the initial position and projects a series of updated image portions 910_1, 9102, 910_3, . . . , and 910_n on picture display screen 830 to display an updated image.

Figure 10:
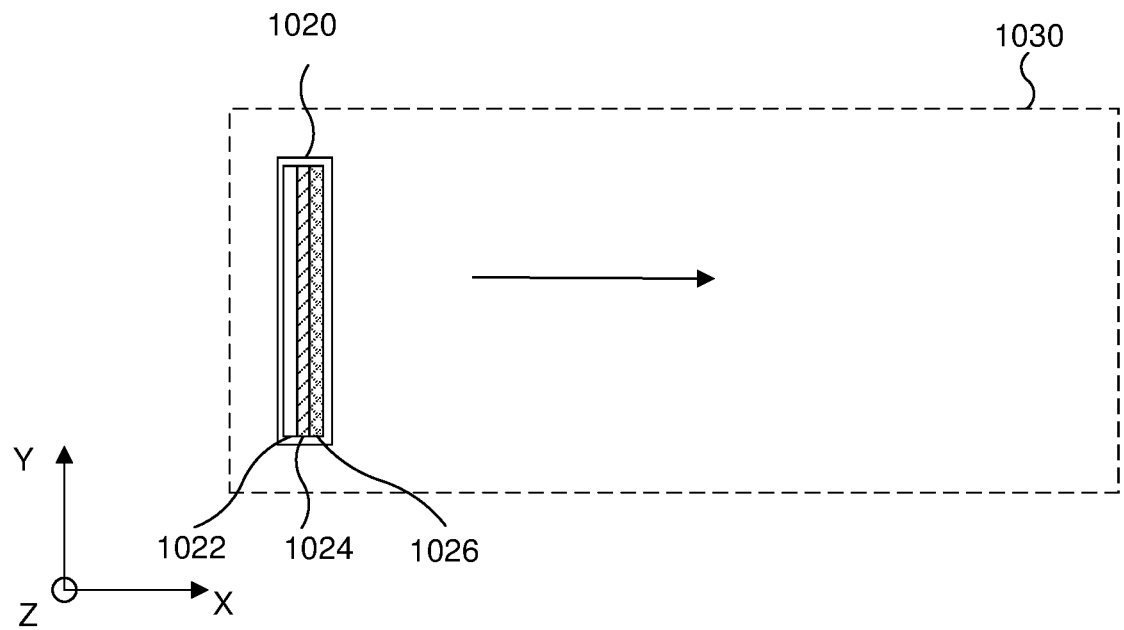
FIG. 10 is a top view of a scan needle and a picture display screen, during a picture scanning process, according to an embodiment of the present disclosure.

FIG. 10 schematically illustrates a scan needle 1020 and a picture display screen 1030 during a picture scanning process as viewed along the Z-axis direction and facing display screen 1030, according to an embodiment of the present disclosure. For the convenience of describing the relative positions of scan needle 1020 and picture display screen 1030, picture display screen 1030 is illustrated as transparent in FIG. 10 to show scan needle 1020 arranged behind picture display screen 1030.

As shown in FIG. 10, scan needle 1020 includes a first color light emitting pixel array 1022 including a plurality of first color light emitting pixels (not illustrated), a second color light emitting pixel array 1024 including a plurality of second color light emitting pixels (not illustrated), and a third color light emitting pixel array 1026 including a plurality of third color light emitting pixels (not illustrated). First color light emitting pixel array 1022, second color light emitting pixel array 1024, and third color light emitting pixel array 1026 are parallel to each other and sequentially arranged along the horizontal direction.

Figure 11:
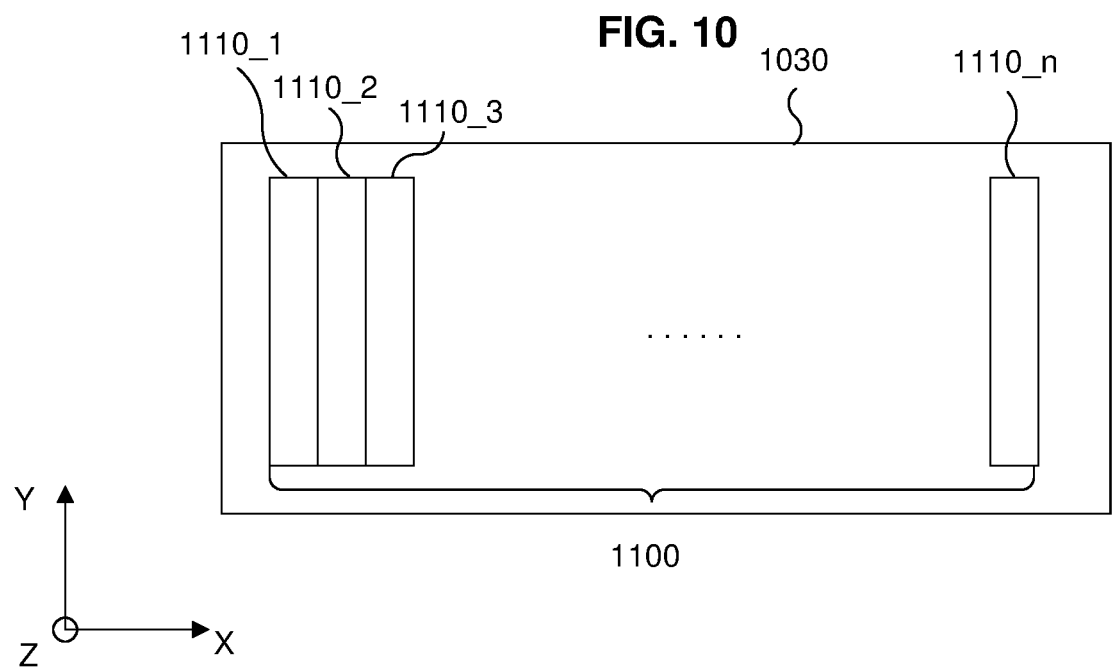
FIG. 11 is a top view of a picture display screen with an image displayed thereon during a picture scanning process, according to an embodiment of the present disclosure.

FIG. 11 schematically illustrates picture display screen 1030 with an image 1100 displayed on a surface during a picture scanning process, according to an embodiment of the present disclosure.

Referring to FIGS. 10 and 11, during the picture scanning process, scan needle 1020 may be driven by a driving unit (such as driving unit 540 in FIG. 5) to move in the horizontal direction relative to picture display screen 1030. At an initial time point t1 during the picture scanning process, scan needle 1020 is located at an initial position and projects a first image portion 1110_1 on picture display screen 1030 at a first and left-most position. At a second time point t2, scan needle 1020 is moved along the horizontal direction and projects a second image portion 1110_2 on picture display screen 1030 at a second position at a right side of the first position as viewed in FIG. 11. Second image portion 11102 may be immediately adjacent to image portion 1110_1. Alternatively, a left portion of image portion 1110_2 may overlap with a right portion of image portion 1110_1. At a third time point t3, scan needle 1020 is moved further along the horizontal direction and projects a third image portion 1110_3 on picture display screen 1030 at a third position at a right side of the second position as viewed in FIG. 11. Image portion 1110_3 may be immediately adjacent to image portion 1110_2. Alternatively, a left portion of image portion 1110_3 may overlap with a right portion of image portion 1110_2. In this manner, the picture scanning process continues with scan needle 1020 successively projecting image portions at successive time points until scan needle 1020 projects a final image portion 1110_n on picture display screen 1030 at a right-most position. As a result, a full image 1100 formed by image portions 1110_1, 1110_2, 1110_3, . . . , and 1110_n is displayed on picture display screen 1030. Afterwards, scan needle 1020 is moved back to the initial position and projects a series of updated image portions 1110_1, 1110_2, 1110_3, . . . , and 1110_n on picture display screen 1030 to display an updated image.

In some alternative embodiments of the present disclosure (not illustrated), a projecting unit (such as projecting unit 850 in FIG. 8) may be used to project light emitted from scan needle 1020 to picture display screen 1030, and the projecting unit may be driven by a driving unit (such as driving unit 840 in FIG. 8) to perform a picture scanning process to scan the light in the horizontal direction relative to picture display screen 1030. The picture scanning process may be similar to the picture scanning process described with respect to FIGS. 8 and 9, except that the light emitted by scan needle 1020 in the current embodiment is caused to scan in the horizontal direction instead of the vertical direction. Therefore, a detailed description of this alternative embodiment is not repeated.

In some alternative embodiments of the present disclosure (not illustrated), a scan needle may not be positioned along the horizontal direction or the vertical direction with respect to a picture display screen. Instead, a side of the scan needle and a side of the picture display screen may form an angle greater than 0 degree and less than 90 degree.

Figure 12:
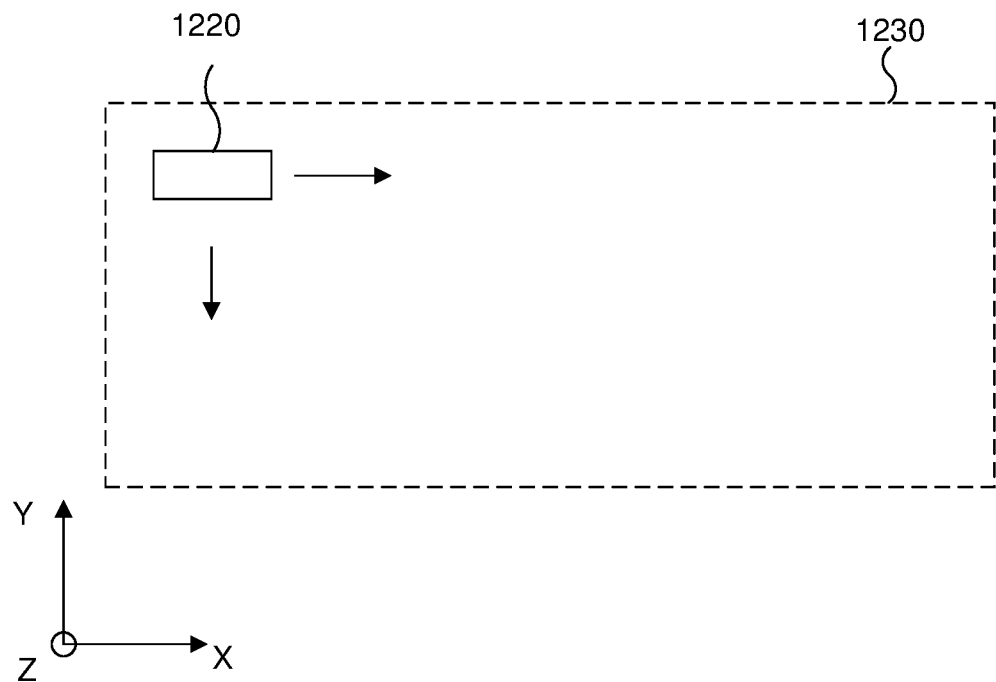
FIG. 12 is a top view of a scan needle and a picture display screen during a picture scanning process, according to an embodiment of the present disclosure.

FIG. 12 schematically illustrates a scan needle 1220 and a picture display screen 1230 during a picture scanning process as viewed along the Z-axis direction and facing picture display screen 1230, according to an embodiment of the present disclosure. For the convenience of describing the relative positions of scan needle 1220 and picture display screen 1230, picture display screen 1230 is illustrated as transparent in FIG. 12 to show scan needle 1220 arranged behind picture display screen 1230.

Scan needle 1220 includes only one pixel comprising at least one of a first color light emitting diode, a second color light emitting diode, and a third color light emitting diode. An aspect ratio of the pixel included in scan needle 1220 is not less than 1:3. A size of the pixel in the horizontal direction is not more than 50 μm, and may be in the range of 10 μm to 12 μm. A size of the pixel in the vertical direction is not more than 50 μm, and may be in the range of 10 μm to 30 μm. In one embodiment, a size of a single light emitting diode is in the range of 0.5 μm to 50 μm. A shape of the pixel is circular or rectangular. In some embodiments, the pixel includes a red light emitting diode, a blue light emitting diode, and a green light emitting diode. An area of the red light emitting diode is larger than an area of the blue light emitting diode, and the area of the blue light emitting diode is larger than an area of the green light emitting diode.

Figure 13:
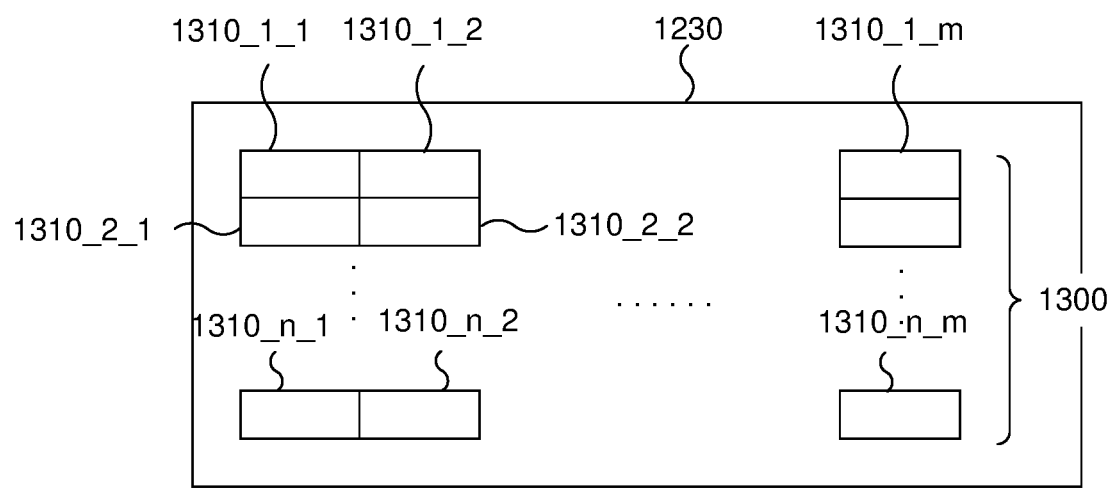
FIG. 13 is a top view of a picture display screen with an image displayed thereon during a picture scanning process, according to an embodiment of the present disclosure.

FIG. 13 schematically illustrates picture display screen 1230 with an image 1300 displayed thereon during a picture scanning process, according to an embodiment of the present disclosure.

Referring to FIGS. 12 and 13, during the picture scanning process, scan needle 1220 may be driven by a driving unit (such as driving unit 540 in FIG. 5) to move in the horizontal direction and in the vertical direction relative to picture display screen 1230. At an initial time point t1 during the picture scanning process, scan needle 1220 is located at an initial position and projects an image portion 1310_1_1 on picture display screen 1230 at the left-most position in a first row. At a second time point t2, scan needle 1220 is moved along the horizontal direction and projects an image portion 1310_1_2 on picture display screen 1230 at a position at a right side of the previous position. In this manner, the picture scanning process continues until scan needle 1220 projects an image portion 1310_1_m on picture display screen 1230 at a top-right position. Then, scan needle 1220 is moved back to the left in the horizontal direction and moves down in the vertical direction to project an image portion 1310_2_1 on picture display screen 1230 at the left-most position in a second row. The driving unit continues to move scan needle 1220 to scan in the horizontal direction to project image portions 1310_2_2, . . . , 1310_2_m in the second row on picture display screen 1230. The process continues until scan needle 1220 projects image portions 1310_n_1, 1310_n_2, . . . , 1310_n_m in a bottom row on picture display screen 1230. As a result, a full image 1300 formed by image portions 1310_1_1, . . . , and 1310_n_m is displayed on picture display screen 1230. Afterwards, scan needle 1020 is moved by the driving unit back to the initial position and projects a series of updated image portions 1310_1_1, . . . , and 1310_n_m on picture display screen 1230 to display an updated image.

In an alternative embodiment of the present disclosure (not illustrated), a projecting unit (such as projecting unit 850 in FIG. 8) may be used to project light emitted from scan needle 1220 to picture display screen 1230, and the projecting unit may be driven by a driving unit (such as driving unit 840 in FIG. 8) to perform a picture scanning process to scan the light in the horizontal direction and in the vertical direction relative to picture display screen 1230. The picture scanning process may be similar to the picture scanning process described with respect to FIGS. 8 and 9, except that the light emitted by scan needle 1220 in the alternative embodiment is caused to scan in both the horizontal direction and the vertical direction instead of only in the vertical direction. Therefore, a detailed description of this alternative embodiment is not repeated.

In the above described embodiments of the present disclosure, the scan display system includes a scan needle including only three light emitting pixel arrays, or even fewer than three light emitting pixel arrays. The scan needle has an area less than the total display area of the picture display screen. Thus, the scan display system of the embodiments of the present disclosure includes far fewer light emitting pixels than a conventional display system which includes light emitting pixels formed on the entire display area. As a result, a manufacturing process may be simplified, manufacturing cost may be reduced, power consumption may be reduced, and package size may be reduced.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A scan needle, comprising,
a substrate;
a first color light emitting pixel array comprising a plurality of first color light emitting pixels formed on the substrate;
a second color light emitting pixel array comprising a plurality of second color light emitting pixels formed on the substrate; and
a third color light emitting pixel array comprising a plurality of third color light emitting pixels formed on the substrate,
wherein
one of the first color light emitting pixel comprises a first segment of a first color light emitting layer,
one of the second color light emitting pixel comprises a second segment of the first color light emitting layer and a first segment of a second color light emitting layer, sequentially stacked on the substrate, and
one of the third color light emitting pixel comprises a third segment of the first color light emitting layer, a second segment of the second color light emitting layer, and a third color light emitting layer, sequentially stacked on the substrate.

2. The scan needle according to claim 1, wherein:
the plurality of first color light emitting pixels in the first color light emitting pixel array are formed in a single row or in a two-dimensional array having at least two rows and two columns;
the plurality of second color light emitting pixels in the second color light emitting pixel array are formed in a single row or in a two-dimensional array having at least two rows and two columns; and
the plurality of third color light emitting pixels in the third color light emitting pixel array are formed in a single row or in a two-dimensional array having at least two rows and two columns.

3. The scan needle according to claim 2, wherein:
the first color light emitting pixel array is a 4000×50 array;
the second color light emitting pixel array is a 4000×50 array; and
the third color light emitting pixel array is a 4000×50 array.

4. The scan needle according to claim 1, wherein:
a pitch of the first color light emitting pixels in a row of the first color light emitting pixel array is less than 5 µm;
a spacing between the first color light emitting pixel array and the second color light emitting pixel array is less than 100 µm;
a pitch of the second color light emitting pixels in a row of the second color light emitting pixel array is less than 5 µm;
a spacing between the second color light emitting pixel array and the third color light emitting pixel array is less than 100 µm; and
a pitch of the third color light emitting pixels in a row of the third color light emitting pixel array is less than 5 µm.

5. The scan needle according to claim 1, wherein:
an aspect ratio of the first color light emitting pixel array is not less than 10:1;
a size of one of the first color light emitting pixels in a row direction of the first color light emitting pixel array is same as a size of one of the second color light emitting pixels in a row direction of the second color light emitting pixel array; and the size of the one of the second color light emitting pixels in the row direction of the second color light emitting pixel array is same as a size of one of the third color light emitting pixels in a row direction of the third color light emitting pixel array.

6. The scan needle according to claim 5, wherein the aspect ratio of the first color light emitting pixel array is not less than 100:1.

7. The scan needle according to claim 1, wherein:
each of the first color light emitting pixels comprises a first color light emitting diode;
each of the second color light emitting pixels comprises a second color light emitting diode; and
each of the third color light emitting pixels comprises a third color light emitting diode.

8. The scan needle according to claim 1, wherein a total width of the scan needle is not more than 1 mm.

9. The scan needle according to claim 8, wherein a total aspect ratio of the scan needle is not less than 3:1.

10. The scan needle according to claim 1, wherein:
a number of the first color light emitting pixels in the first color light emitting pixel array is the same as a number of the second color light emitting pixels in the second color light emitting pixel array; and
the number of the second color light emitting pixels in the second color light emitting pixel array is the same as a number of the third color light emitting pixels in the third color light emitting pixel array.

11. The scan needle according to claim 1, wherein a shape of each of the first color light emitting pixels, the second color light emitting pixels, and the second color light emitting pixels is circular or rectangular.

12. The scan needle according to claim 1, wherein:
each of the first color light emitting pixels comprises a red light emitting pixel;
each of the second color light emitting pixels comprises a blue light emitting pixel; and
each of the third color light emitting pixels comprises a green light emitting pixel.

13. The scan needle according to claim 12, wherein:
an area of one of the first color light emitting pixels is larger than an area of one of the second color light emitting pixels; and
an area of the one of the second light emitting pixels is larger an area of one of the third light emitting pixels.

14. The scan needle according to claim 1, further comprising:
light-isolating walls formed on the substrate and between the first color light emitting pixel array and the second color light emitting pixel array, and between the second color light emitting pixel array and the third color light emitting pixel array.

15. The scan needle according to claim 14, wherein a height of the light-isolating walls is greater than a height of the highest one of the first color light emitting pixels, the second color light emitting pixels, and the third color light emitting pixels.

16. The scan needle according to claim 1, wherein an area of one of the first color light emitting pixels is the same as an area of one of the second color light emitting pixels, and
the area of one of the second color light emitting pixels is the same as an area of one of the third color light emitting pixels.

17. The scan needle according to claim 1, wherein:
an area of one of the first color light emitting pixels is larger than an area of one of the second color light emitting pixels; and
the area of the one of the second light emitting pixels is larger an area of one of the third light emitting pixels.

18. The scan needle according to claim 1, further comprising:
microlenses respectively formed on at least one of the first color light emitting pixels, second color light emitting pixels, and third color light emitting pixels.

* * * * *

UNITED STATES PATENT AND TRADEMARK OFFICE
CERTIFICATE OF CORRECTION

PATENT NO. : 12,068,358 B2
APPLICATION NO. : 18/063220
DATED : August 20, 2024
INVENTOR(S) : Qunchao Xu et al.

Page 1 of 1

It is certified that error appears in the above-identified patent and that said Letters Patent is hereby corrected as shown below:

In the Claims

• Claim 1, Column 14, Line 15, "one of the first color light emitting pixel comprises" should read --one of the first color light emitting pixels comprises--.

• Claim 1, Column 14, Line 17, "one of the second color light emitting pixel comprises" should read --one of the second color light emitting pixels comprises--.

• Claim 1, Column 14, Line 21, "one of the third color light emitting pixel comprises" should read --one of the third color light emitting pixels comprises--.

• Claim 5, Column 14, Line 67–Column 15, Line 1, "is same" should read --is the same--.

• Claim 5, Column 15, Line 6, "is same" should read --is the same--.

• Claim 13, Column 16, Line 8, "larger an" should read --larger than an--.

• Claim 17, Column 16, Line 33, "larger an" should read --larger than an--.

Signed and Sealed this
Fourteenth Day of January, 2025

Derrick Brent
*Acting Director of the United States Patent and Trademark Office*